US005776809A

United States Patent [19]
Schuegraf

[11] Patent Number: 5,776,809
[45] Date of Patent: Jul. 7, 1998

[54] METHOD FOR FORMING A CAPACITOR

[75] Inventor: Klaus Florian Schuegraf, Boise, Id.

[73] Assignee: Micron Technology, Inc., Boise, Id.

[21] Appl. No.: 660,847

[22] Filed: Jun. 10, 1996

[51] Int. Cl.$^6$ .............................................. H01L 21/8242
[52] U.S. Cl. ............................................ 438/255; 438/398
[58] Field of Search .................................. 438/253, 254, 438/396, 397, 255, 398

[56] References Cited

U.S. PATENT DOCUMENTS 5,371,039  12/1994  Oguro ............................ 437/101

*Primary Examiner*—Jey Tsai
*Attorney, Agent, or Firm*—Wells, St. John, Roberts, Gregory & Matkin, P.S.

[57]  ABSTRACT

A capacitor and a method for forming a capacitor is described and which includes providing a node location to which electrical connection to a capacitor is to be made; providing an amorphous inner capacitor plate layer of a first material atop the node location; providing a capacitor dielectric layer outwardly of the first material; after providing the capacitor dielectric layer, rendering the first material to be polycrystalline; providing an electrically conductive outer capacitor plate layer outwardly of the capacitor dielectric layer; and providing the first material to be electrically conductive. The capacitor formed by the present method exhibits current leakage characteristics which are substantially symmetrical with respect to both positive and negative voltage bias and characterized by differences between the positive and negative voltage bias being within less than about 10 percent for a predetermined voltage.

34 Claims, 4 Drawing Sheets

5,776,809

METHOD FOR FORMING A CAPACITOR

TECHNICAL FIELD

This invention relates to capacitor construction and to methods for forming capacitors.

BACKGROUND OF THE INVENTION

The prior art is replete with numerous examples of capacitors which are fabricated to address various design criterion. For example, as semiconductor devices get smaller in size, designers are faced with a myriad of problems related to the production of capacitors which maintain sufficient capacitance in spite of the smaller size. As a general matter, capacitance can, on the one hand, be enhanced by increasing the surface area of the capacitor dielectric layer; or on the other hand, by decreasing the capacitor dielectric layer thickness.

Heretofore designers of semiconductor devices have focused their attention on increasing the outer surface area of the inner capacitor plate by means of depositing polysilicon which has a rough surface texture. Hemispherical grain polysilicon is often utilized for this purpose. This increase in the outer surface area of the inner capacitor plate translates into increased capacitor dielectric surface area.

While the use of the technique, such as described above, has worked with some degree of success, there are several aspects of this same and other techniques which have detracted from their usefulness. For example, as contact openings become smaller in size, the use of materials such as hemispherical grain polysilicon becomes less attractive because the rough outer surface of such materials facilitates plugging or otherwise occluding smaller contact openings.

The method of the present invention is employed to address these and other problems.

DETAILED DESCRIPTION OF THE PREFERRED EMBODIMENTS

Figure 1:
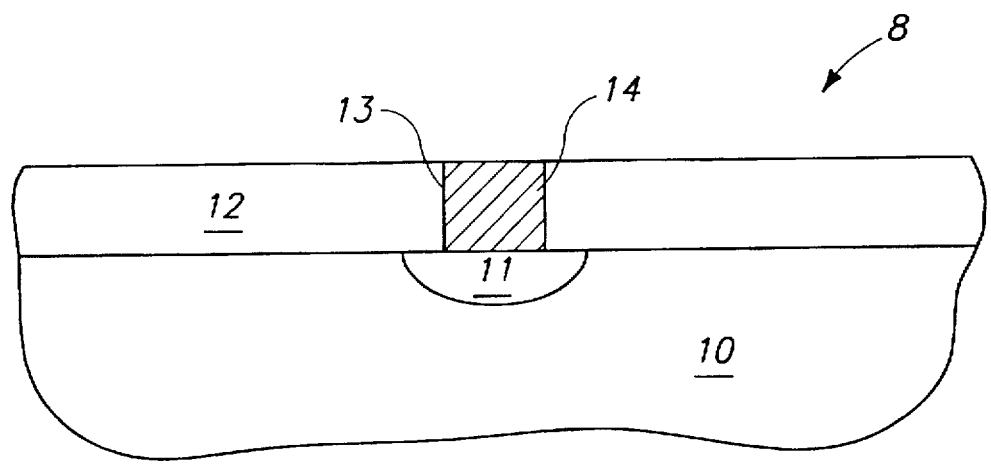
FIG. 1 is a partial, vertical, cross sectional view of a semiconductor wafer fragment at one processing step in accordance with the present invention.

This disclosure of the invention is submitted in furtherance of the constitutional purposes of the U.S. Patent Laws "to promote the progress of science and useful arts" (Article 1, Section 8).

In accordance with one aspect of the invention, a method for forming a capacitor on a semiconductor substrate structure, includes:

providing a generally amorphous silicon layer on the semiconductor substrate structure;

providing a dielectric layer over the amorphous silicon layer; and after providing the dielectric layer, providing conditions effective to cause the amorphous silicon layer to become substantially polycrystalline and electrically conductive.

Another aspect of the present invention relates to a method for forming a capacitor which includes:

providing a node location to which electrical connection to a capacitor is to be made;

providing an amorphous inner capacitor plate of a first material atop the node location;

providing a capacitor dielectric layer outwardly of the first material;

after providing the capacitor dielectric layer, rendering the first material to be polycrystalline;

providing an electrically conductive outer capacitor plate layer outwardly of the capacitor dielectric layer; and providing the first material to be electrically conductive.

Still another aspect of the present invention relates to a method for forming a capacitor which includes:

providing a node location to which electrical connection to a capacitor is to be made;

providing an amorphous inner silicon capacitor plate atop the node location, the inner silicon capacitor plate provided to a thickness of less than about 400 Angstroms;

patterning and etching the inner silicon capacitor plate to a predetermined shape;

providing a dielectric layer atop the inner silicon capacitor plate, the dielectric layer provided to a thickness of not greater than about 60 Angstroms;

after providing the capacitor dielectric layer, rendering the inner silicon capacitor plate to be polycrystalline;

providing an electrically conductive outer capacitor plate outwardly of the capacitor dielectric layer; and providing the inner silicon capacitor plate to be electrically conductive.

Yet another aspect of the present invention relates to a method for forming a capacitor on a semiconductor wafer structure, including:

providing an amorphous silicon first layer on the semiconductor wafer structure, the amorphous silicon first layer having a first degree of electrical conductivity;

providing a dielectric structure over the amorphous silicon first layer;

providing a conductive layer of material over the dielectric structure;

after providing the dielectric structure, providing conditions effective to cause the amorphous silicon first layer to become at least partially polycrystalline; and providing conditions effective to cause the at least partially polycrystalline silicon first layer to have a second degree of conductivity which is greater than the first degree of conductivity.

Yet, still a further aspect of the present invention relates to a capacitor which includes:

an inner electrically conductive capacitor plate;

an outer electrically conductive capacitor plate; and a dielectric layer disposed intermediate the inner and outer capacitor plates; the inner and outer capacitor plates and the dielectric layer having current leakage characteristics which are substantially symmetrical with respect to both positive and negative voltage bias, the symmetry characterized by the differences between the respective positive and negative voltage bias being within less than about 10% for bias voltages of less than or equal to about 5 volts.

Referring to FIG. 1, a semiconductor wafer fragment or structure in process is shown generally by the numeral 8. Such comprises a bulk monocrystalline substrate 10 having an electrically conductive diffusion region 11 provided therein. Region 11 constitutes a node location to which electrical connection to an inner capacitor plate is to be made. A layer of silicon dioxide 12 is provided atop the bulk substrate 10, and a contact opening 13 is provided through the layer of silicon dioxide 12 to the underlying node 11. Further, a conductive plug 14 is provided in the contact opening and is electrically coupled with the underlying node 11.

Figure 2:
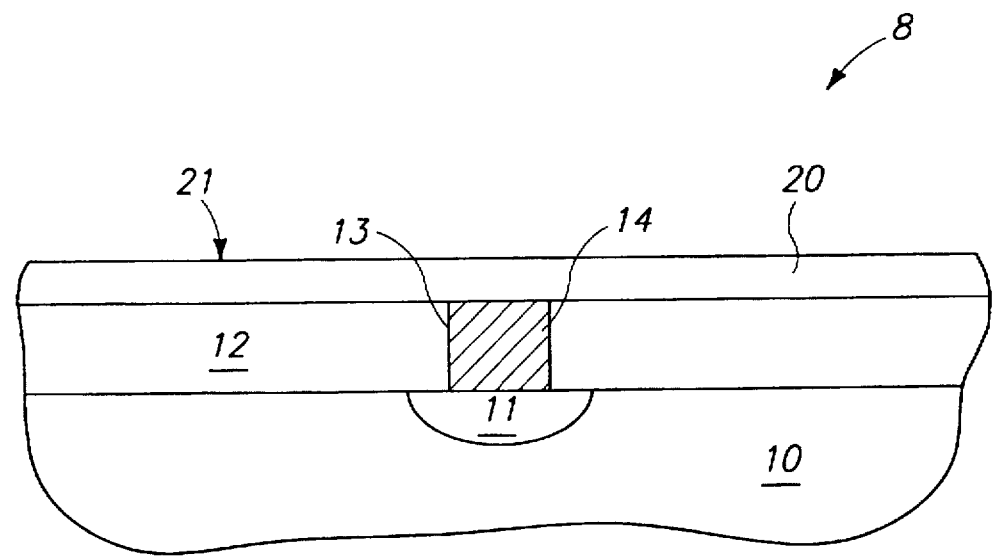
FIG. 2 is a view of the FIG. 1 semiconductor wafer fragment at a processing step subsequent to that shown in FIG. 1.

Referring now to FIG. 2, a generally amorphous inner capacitor plate layer 20 of a first material, preferably amorphous silicon, is provided atop the silicon dioxide layer 12 to a preferred thickness of less than about 400 Angstroms. The inner capacitor plate layer 20 has an exterior facing surface 21. The inner capacitor plate layer 20 is preferably provided in a manner which provides, to the extent possible, an atomically smooth outer surface 21, in an effort to minimize undesired current leakage between the resultant capacitor plates. An example, and preferred process for providing such an inner capacitor plate layer 20 includes, providing the inner capacitor plate at a pressure of less than about 3 TORR, and a temperature of less than about 580 degrees C. Preferably, the inner capacitor plate is provided at a pressure of about 200 mTORR; a temperature of about 535 degrees C.; and in a $SiH_4$ and Phosphine ambient. The absence of micrograins, as determined by employing a transelectron microscope, provides evidence that an atomically smooth outer surface 21 has been achieved.

In providing the inner capacitor plate, it has been discovered that as the temperature of deposition increases, the deposition rate also increases. However, a corresponding decrease in the amorphous nature of subsequent inner capacitor plate deposit also simultaneously occurs. On the other hand, as pressure is increased, the rate of deposit also increases. However, an increase in pressure also results in a corresponding increase in the amorphous nature of the inner capacitor plate deposit.

As noted above, an atomically smooth outer surface 21 may be characterized by a number of techniques including the use of atomic force microscopy, and in particular the use of root mean square measurements; or surface area difference determinations. Still further, and as earlier described, the use of a transelectron microscope which shows the presence or absence of micrograins in the resultant inner capacitor plate may also be employed. The presence of micrograins evidences that an atomically smooth surface has not been achieved. Such an atomically smooth surface as earlier noted, minimizes current leakage through the very thin capacitor dielectric plates, which are most preferably utilized in accordance with the most preferred aspects of the present invention.

Figure 3:
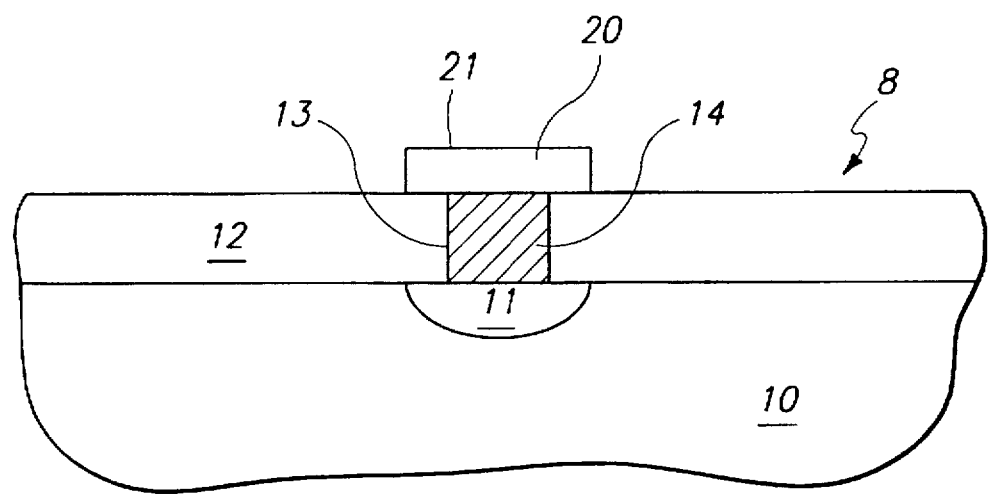
FIG. 3 is a view of the FIG. 2 semiconductor wafer fragment at a processing step subsequent to that shown in FIG. 2.

Referring to FIG. 3, inner capacitor plate layer 20 is masked with a suitable masking material, such as photoresist, and patterned and etched into a desired resultant lower or inner capacitor plate shape. The masking layer is then removed. All is preferably conducted in a manner which does not adversely decrease the atomic smoothness of exterior surface 21, that is, making it rougher by such processing. Such processing steps for example include the use of photoresist removal techniques which minimize, to the extent possible, the oxidation of the capacitor plate surface. Such might include, for example, performing the photoresist removal at low temperatures, and reducing the ammonia hydroxide ratios in peroxide mixtures used in precleaning.

Figure 4:
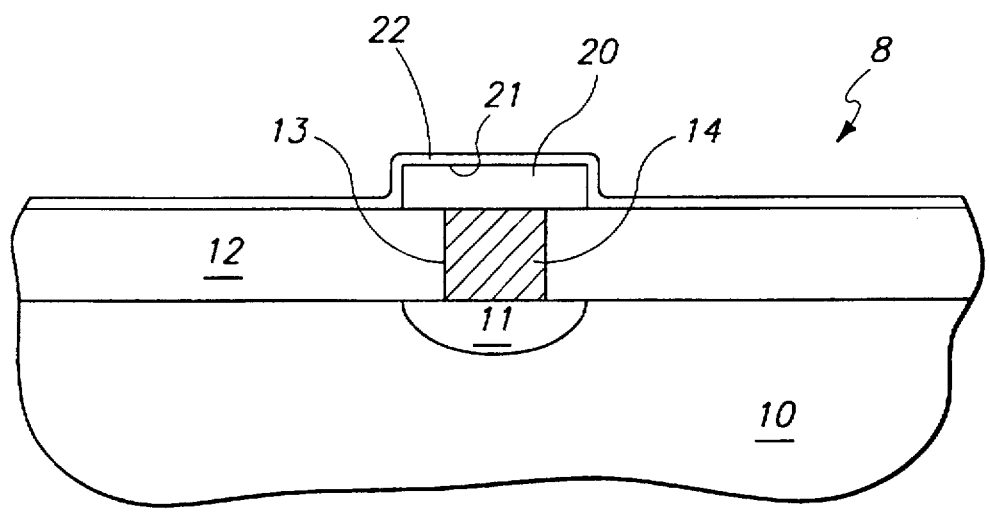
FIG. 4 is a view of the FIG. 3 semiconductor wafer fragment at a processing step subsequent to that shown in FIG. 3.

Referring now to FIG. 4, a dielectric layer, or dielectric structure 22 is provided atop the inner capacitor plate 20. The dielectric layer 22 is preferably provided to be very thin, for example, to a thickness of not greater than about 60 Angstroms. The dielectric layer 22 preferably comprises a composite layer of silicon nitride and silicon dioxide. In the alternative, the dielectric structure may comprise a composite oxide-nitride-oxide layer. More specifically, the silicon nitride layer preferably has a thickness of not greater than about 50 Angstroms, and the oxide layer has a thickness of about 4 Angstroms to about 10 Angstroms. The silicon nitride layer can be provided by chemical vapor deposition by using dichlorosilane and ammonia as precursors. An example process utilizes a temperature of greater than about 600 degrees C. and a pressure of less than about 3 TORR. Most preferably, the chemical vapor deposition occurs at a preferred temperature of about 680 degrees C. and a pressure of about 500 mTORR. The dielectric layer or structure 22 is preferably provided by the above manner so as not to appreciably decrease the atomic smoothness of the outer surface 21 during the provision of the dielectric plate 22, nor substantially change the first material forming the inner capacitor plate 20 from the amorphous to crystalline phase.

Figure 5:
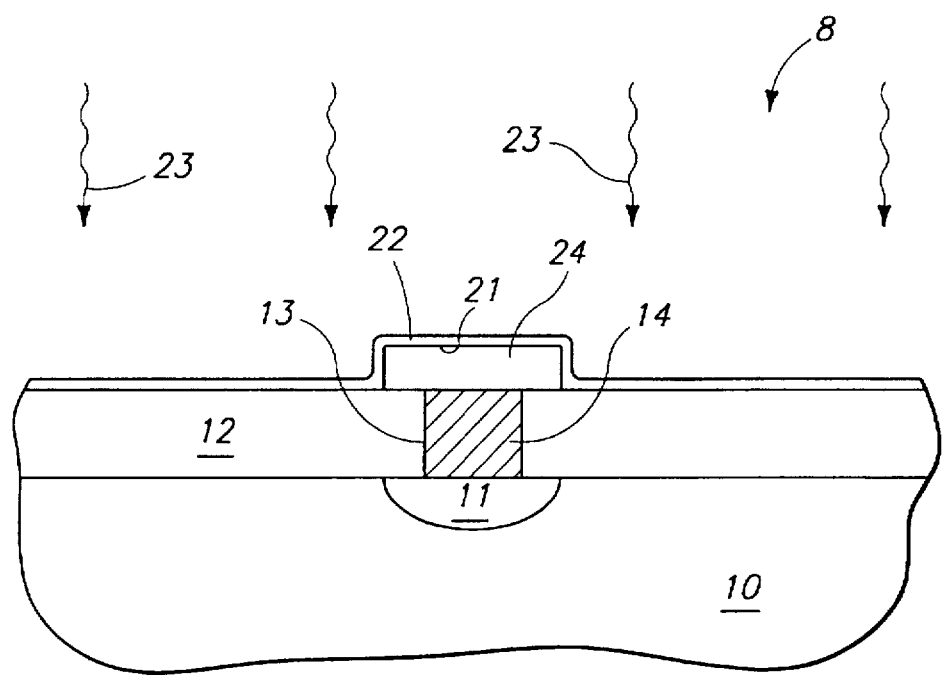
FIG. 5 is a view of the FIG. 4 semiconductor wafer fragment at a processing step subsequent to that shown in FIG. 4.

Referring now to FIG. 5, after providing the capacitor dielectric plate 22, the method further comprises rendering the first material forming the inner silicon capacitor plate 20 to be polycrystalline 24. The amorphous silicon inner capacitor plate layer 20 can be converted to the polycrystalline layer 24 by the application of heat. The heat is graphically illustrated by the numeral 23. Rendering the inner capacitor plate layer 20 to be polycrystalline after provision of the dielectric layer 22 is intended to substantially seal the atomic smoothness of outer surface 21 in the resultant construction. For example, a dedicated heat treatment to render the first material forming the inner capacitor plate 20 polycrystalline would include exposure of the semiconductor wafer 8 to temperatures of about 800 degrees C. for about 30 minutes in an oxidizing ambient. Alternatively, inherent subsequent semiconductor wafer processing can be utilized to subject the semiconductor wafer 8 to annealing conditions.

The first material forming the inner capacitor plate layer 20 may be electrically conductive as initially provided, or initially provided as a semiconductive or electrically insulative material. For example, inner capacitor plate layer 20 can be in situ conductively doped during a chemical vapor deposition process such that it is inherently conductive upon its formation. Further where such first material is to be rendered electrically conductive after its deposition, such ion implanting 27, for example, might be conducted either before or after rendering the first capacitor plate layer 20 to be polycrystalline. Still further, the inner capacitor plate layer 20 could be patterned before or after the phase change from amorphous to polycrystalline states. The preferred technique of addressing these and other variables would utilize a process flow which effectively results in the most atomically smooth outer surface 21 achievable. The preferred sequence of steps for facilitating this objective is depositing the capacitor dielectric layer 22 under the preferred conditions; providing the polycrystalline layer 24 by utilizing a low temperature to inhibit recrystallization; and then performing an oxidizing anneal of the polycrystalline layer.

Figure 6:
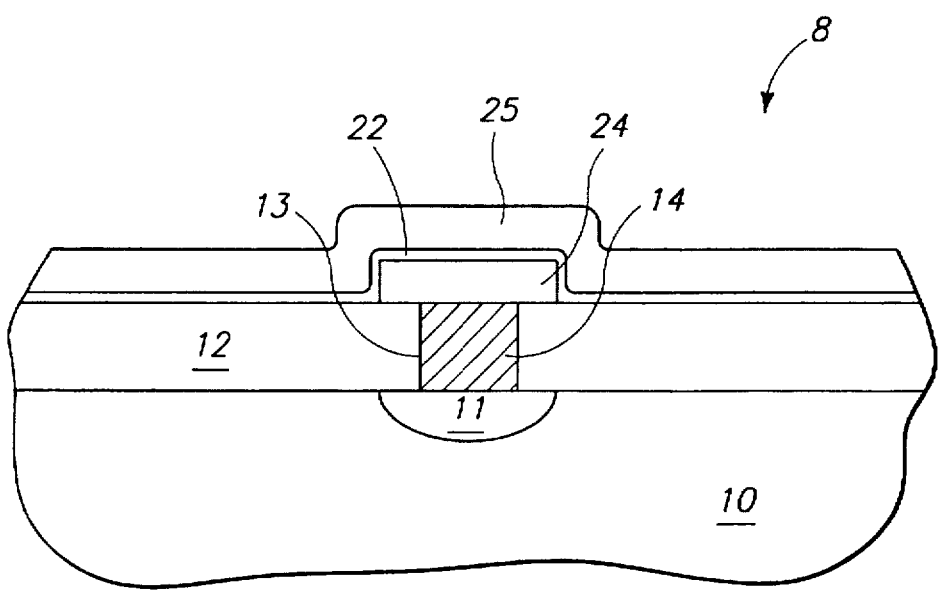
FIG. 6 is a view of the FIG. 5 semiconductor wafer fragment at a processing step subsequent to that shown in FIG. 5.

Referring to FIG. 6, an electrically conductive outer capacitor layer 25 is ultimately provided outwardly of capacitor dielectric layer 22. An example and preferred material for layer 25 is conductively doped polysilicon.

Figure 7:
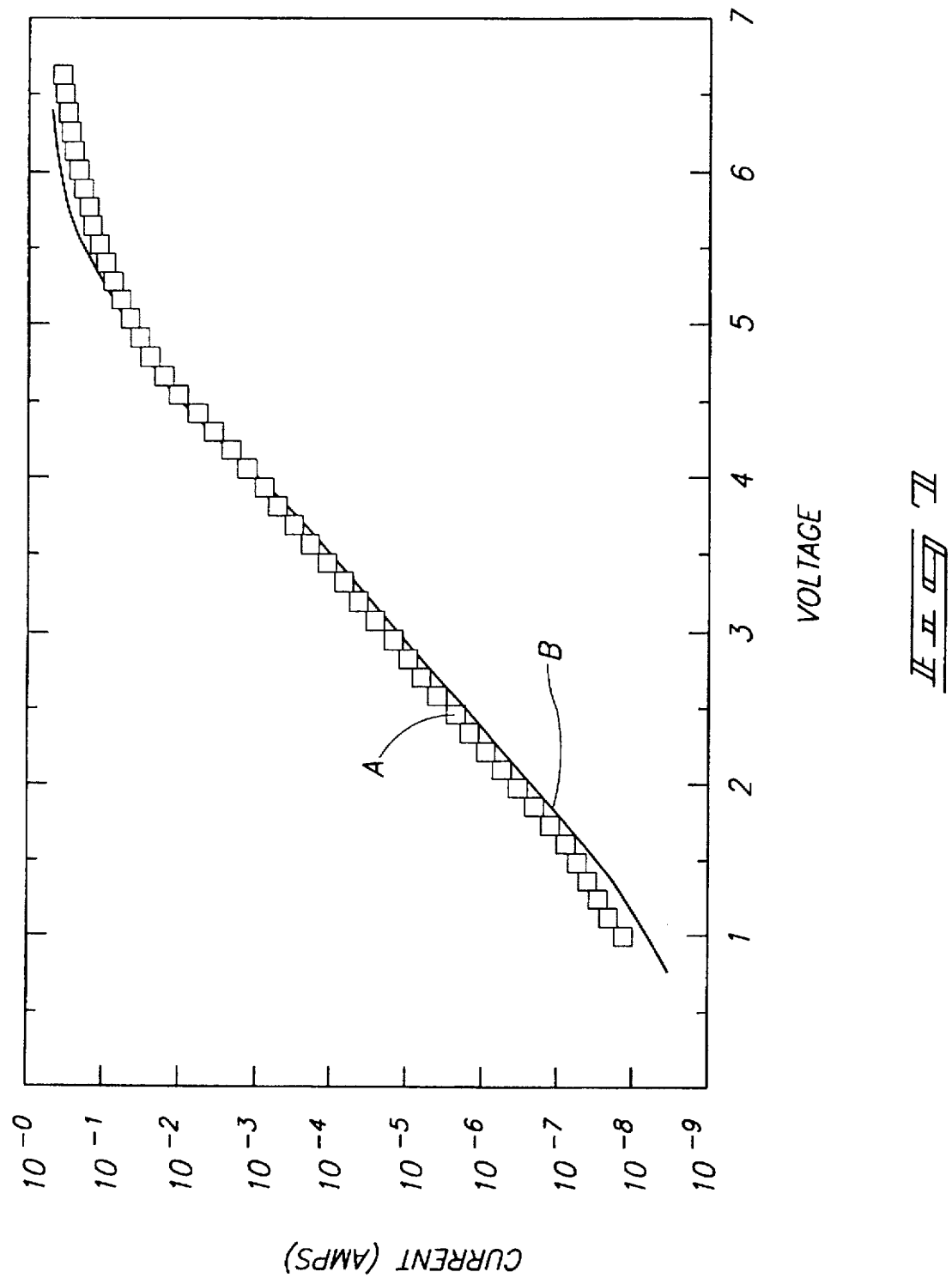
FIG. 7 is a graph which depicts the current leakage characteristics of a capacitor manufactured in accordance with the teachings of the present invention.

The method of the present invention provides a capacitor which has an inner electrically conductive capacitor plate 20; an outer electrically conductive capacitor plate 25; and a dielectric layer 22 disposed intermediate the inner and outer capacitor plates, the inner 20 and outer 24 capacitor plates and the dielectric layer 22 having current leakage characteristics which are substantially symmetrical with respect to both positive and negative voltage bias, the voltage bias being less than about 10%. In particular, the differences between the respective positive and negative voltage biases are within about 10% of one another for bias voltages of less than or equal to about 5 volts. This is graphically depicted in FIG. 7. The line labeled "A" illustrates positive voltage bias, and line "B" illustrates negative voltage bias for a specific reduction to practice capacitor manufactured in accordance with the present invention. Such capacitor comprises a bottom capacitor plate formed by in-situ doping with arsine and phosphine; a top capacitor plate formed by in situ doping with phosphine; and an intermediate substantially 50 Angstrom thick silicon nitride layer. Such structure was prepared using a wet oxidation anneal performed at 800 degrees C. for 15 minutes duration.

In compliance with the statute, the invention has been described in language more or less specific as to structural and methodical features. It is to be understood, however, that the invention is not limited to the specific features shown and described herein, since the means disclosed comprise preferred forms of putting the invention into effect. The invention is, therefore, claimed in any of its forms or modifications within the proper scope of the appended claims appropriately interpreted in accordance with the Doctrine of Equivalents.

I claim:

1. A method for forming a capacitor on a semiconductor substrate structure, comprising:

providing a generally amorphous silicon layer on the semiconductor structure, the silicon layer having an outermost surface;

determining the atomic smoothness of the outermost surface of the amorphous silicon layer, the absence of micrograins indicating that an atomically smooth outermost surface has been achieved;

providing a dielectric layer over the amorphous silicon layer, and wherein the step of providing the dielectric layer does not substantially decrease the atomic smoothness of the outermost surface of the amorphous silicon layer nor substantially change the amorphous silicon layer to a crystalline phase;

after providing the dielectric layer, providing conditions effective to cause the amorphous silicon layer to become substantially polycrystalline and electrically conductive.

2. A method as claimed in claim 1, wherein the dielectric layer is provided to a thickness of not greater than about 60 Angstroms.

3. A method as claimed in claim 1, wherein the amorphous silicon layer is provided to a thickness of less than about 400 Angstroms.

4. A method as claimed in claim 1, wherein the amorphous silicon layer is electrically conductive as initially provided.

5. A method as claimed in claim 1, wherein the amorphous silicon layer is not electrically conductive as initially provided, the amorphous silicon layer rendered electrically conductive, after the amorphous silicon layer is rendered polycrystalline.

6. A method as claimed in claim 1, wherein the dielectric layer consists essentially of a composite of silicon nitride and oxide having a combined thickness of not greater than about 60 Angstroms.

7. A method as claimed in claim 1, wherein after providing the amorphous silicon layer polycrystalline, and before rendering the amorphous silicon layer electrically conductive, providing an electrically conductive layer of material over the dielectric layer, and wherein the amorphous silicon layer, and the electrically conductive layer provide current leakage characteristics which are substantially symmetrical with respect to both positive and negative voltage bias.

8. A method as claimed in claim 7, wherein the substantial symmetry is characterized by differences between the respective positive and negative voltage bias being within about 10% of one another for bias voltages of less than or equal to about 5 volts.

9. A method for forming a capacitor, comprising:

providing a node location to which electrically connection to a capacitor is to be made;

providing an amorphous inner capacitor plate layer of a first material atop the node location, the inner capacitor plate layer having an outermost surface;

determining the atomic smoothness of the outermost surface of inner capacitor plate layer, the absence of micrograins on the outermost surface indicating that an atomically smooth outermost surface has been achieved;

providing a capacitor dielectric layer outwardly of the first material, and wherein the step of providing the capacitor dielectric layer does not substantially decrease the atomic smoothness of the outermost surface of the inner capacitor plate layer nor substantially change the amorphous inner capacitor plate layer to a crystalline phase;

after providing the capacitor dielectric layer, rendering the first material to be polycrystalline;

providing an electrically conductive outer capacitor plate layer outwardly of the capacitor dielectric layer; and providing the first material to be electrically conductive.

10. A method for forming a capacitor as claimed in claim 9, wherein the capacitor dielectric layer has a thickness of not greater than about 60 Angstroms.

11. A method for forming a capacitor as claimed in claim 9, wherein the first material comprises silicon which is provided to a thickness of less than about 400 Angstroms.

12. A method for forming a capacitor as claimed in claim 9, wherein the first material is electrically conductive as initially provided.

13. A method for forming a capacitor as claimed in claim 9, wherein the first material is not electrically conductive as initially provided, the first material being provided to be electrically conductive before rendering it polycrystalline.

14. A method for forming a capacitor as claimed in claim 9, wherein the capacitor dielectric layer comprises silicon nitride provided to a thickness of not greater than about 60 Angstroms.

15. A method for forming a capacitor as claimed in claim 9, wherein the capacitor dielectric layer consists essentially of a composite of silicon nitride and oxide having a combined thickness of not greater than about 60 Angstroms.

16. A method for forming a capacitor as claimed in claim 9, wherein the capacitor dielectric layer comprises a composite of silicon nitride and oxide, the silicon nitride having a thickness of not greater than about 50 Angstroms, and the oxide having a thickness of from about 4 Angstroms to about 10 Angstroms.

17. A method for forming a capacitor as claimed in claim 9, wherein the inner capacitor plate layer, the dielectric layer, and the upper capacitor plate layer provide capacitor current leakage characteristics which are substantially symmetrical with respect to both positive and negative voltage bias.

18. A method for forming a capacitor as claimed in claim 17, wherein the substantial symmetry is characterized by differences between the respective positive and negative voltage bias being within about 10 percent of one another for bias voltages of less than or equal to about 5 volts.

19. A method for forming a capacitor on a semiconductive wafer structure, comprising providing an amorphous silicon first layer on the semiconductor wafer structure, the amorphous silicon first layer having a first degree of electrical conductivity and an outermost surface;

determining the atomic smoothness of the outermost surface of the amorphous silicon first layer, the absence of micrograins on the outermost surface indicating that an atomically smooth outermost surface has been achieved;

providing a dielectric structure over the amorphous silicon first layer, the step of providing the dielectric structure being conducted in a manner which does not substantially decrease the atomic smoothness of the outermost surface nor substantially changes the amorphous silicon first layer to a crystalline phase;

providing a conductive layer of material over the dielectric structure;

after deposition of the dielectric structure, providing conditions effective to cause the amorphous silicon first layer to become at least partially polycrystalline; and providing conditions effective to cause the at least partially polycrystalline silicon first layer to have a second degree of conductivity which is greater than the first degree of conductivity.

20. A method as claimed in claim 19, wherein the amorphous silicon first layer is caused to be at least partially polycrystalline after providing the dielectric structure, and prior to providing the conductive layer of material.

21. A method as claimed in claim 20, wherein the dielectric structure comprises a composite oxide-nitride-oxide layer.

22. A method as claimed in claim 20, wherein the amorphous silicon first layer, dielectric structure, and the conductive layer of material provide current leakage characteristics which are substantially symmetrical with respect to both positive and negative voltage bias, the respective, positive and negative voltage bias being within about 10% of one another for bias voltages of use than or equal to about 5 volts.

23. A method for forming a capacitor, comprising:

providing a node location to which electrically connection to a capacitor is to be made;

providing an amorphous inner silicon capacitor plate atop the node location, the inner silicon capacitor plate provided to a thickness of less than about 400 Angstroms and having an outermost surface;

patterning and etching the inner silicon capacitor plate to a shape, the patterning and etching step being conducted in a manner which does not substantially decrease the atomic smoothness of the outermost surface;

providing a dielectric layer atop the patterned inner silicon capacitor plate, the dielectric layer provided to a thickness of not greater than about 60 Angstroms, and wherein the step of providing the dielectric layer does not substantially decrease the atomic smoothness of the outermost surface nor substantially change the inner silicon capacitor plate to a crystalline phase;

after providing the capacitor dielectric layer, rendering the inner silicon capacitor plate to be polycrystalline;

providing an electrically conductive outer capacitor plate outwardly of the capacitor dielectric layer; and providing the inner silicon capacitor plate to be electrically conductive.

24. A method for forming a capacitor as claimed in claim 23, wherein the inner silicon capacitor plate is electrically conductive as initially provided.

25. A method for forming a capacitor as claimed in claim 23, wherein the inner silicon capacitor plate is not electrically conductive as initially provided, the inner silicon capacitor plate provided to be electrically conductive after rendering it polycrystalline.

26. A method for forming a capacitor as claimed in claim 23, wherein the inner silicon capacitor plate is not electrically conductive as initially provided, the inner silicon capacitor plate being provided to be electrically conductive before rendering it polycrystalline.

27. A method for forming a capacitor as claimed in claim 23, wherein the capacitor dielectric layer comprises silicon nitride.

28. A method for forming a capacitor as claimed in claim 23, wherein the capacitor dielectric layer consists essentially of a composite of silicon nitride and oxide.

29. A method for forming a capacitor as claimed in claim 23, wherein the capacitor dielectric layer comprises a composite of silicon nitride and oxide, the silicon nitride having a thickness of not greater than about 50 Angstroms, and the oxide having a thickness of from about 4 Angstroms to about 10 Angstroms.

30. A method for forming a capacitor as claimed in claim 23, wherein the inner capacitor plate, the dielectric layer, and the upper capacitor plate provide capacitor current leakage characteristics which are substantially symmetrical with respect to both positive and negative voltage bias.

31. A method for forming a capacitor as claimed in claim 30, wherein the substantial symmetry is characterized by differences between the respective positive and negative voltage bias being within about 10 percent of one another for bias voltages of less than or equal to about 5 volts.

32. A method for forming a capacitor, comprising:

providing a node location to which electrical connection to a capacitor is to be made;

providing on amorphous silicon inner capacitor plate atop the node location, the amorphous inner capacitor plate being provided to have an atomically smooth outermost surface;

determining the atomic smoothness of the outermost surface of the amorphous silicon inner capacitor plate, the absence of micrograins on the outermost surface indicating that an atomically smooth outermost surface has been achieved;

etching the amorphous silicon inner capacitor plate into a shape, the etching step being conducted in a manner which does not substantially decrease the atomic smoothness of the outermost surface;

providing a capacitor dielectric layer over the atomically smooth outermost surface in a manner which substantially seals the outermost surface, and wherein the step of providing the capacitor dielectric layer does not substantially decrease the atomic smoothness of the outer surface nor substantially change the amorphous silicon inner capacitor plate to a crystalline phase;

after providing the capacitor dielectric layer over the atomically smooth surface, rendering the silicon inner capacitor plate to be polycrystalline;

providing an electrically conductive outer capacitor plate outwardly of the capacitor dielectric layer; and providing the silicon inner capacitor plate to be electrically conductive, and wherein the inner and outer capacitor plates have current leakage characteristics which are substantially symmetrical with respect to both positive and negative voltage bias which is less than about 10%.

33. A method for forming a capacitor as claimed in claim 32; wherein the dielectric layer comprises a composite of silicon nitride which is provide to a thickness of not greater than about 50 Angstroms, and an oxide layer provided to a thickness of not greater than about 10 Angstroms.

34. A method for forming a capacitor as claimed in claim 32, wherein the inner capacitor plate has a thickness of less than about 400 Angstroms.

* * * * *